United States Patent [19]

Tanaka et al.

[11] Patent Number: 4,464,629
[45] Date of Patent: Aug. 7, 1984

[54] HALL ELEMENT DEVICE

[75] Inventors: Shikei Tanaka, Chigasaki; Kunihiko Matsui, Kawasaki, both of Japan

[73] Assignee: Tokyo Shibaura Denki Kabushiki Kaisha, Kawasaki, Japan

[21] Appl. No.: 357,809

[22] Filed: Mar. 15, 1982

[30] Foreign Application Priority Data

Jun. 26, 1981 [JP]  Japan .................................. 56-99354

[51] Int. Cl.³ ............................................. H03F 15/00
[52] U.S. Cl. ....................................... 330/6; 307/309;
324/117 H; 324/142; 330/69
[58] Field of Search ....................... 330/6, 69; 307/309;
328/160; 324/107, 117 H, 142, 251; 364/847;
323/294, 368

[56] References Cited

U.S. PATENT DOCUMENTS 2,988,650  6/1961  Weiss .
3,328,689  6/1967  Rainer .................................. 330/6 X
4,199,696  4/1980  Tanaka et al. ............... 324/117 H X

FOREIGN PATENT DOCUMENTS

A822210  10/1959  United Kingdom .
A868765  5/1961  United Kingdom .

OTHER PUBLICATIONS

"Electromagnetic Converting Element", S. Kataoka, p. 100, Published 1965.
"Introduction of a Sensor Technique", p. 179, Published 1980.

Primary Examiner—James B. Mullins
Attorney, Agent, or Firm—Oblon, Fisher, Spivak, McClelland & Maier

[57] ABSTRACT

A Hall element device comprising a plurality of Hall elements including a first and last Hall element, each of the elements including a first input, a second input, a first output and a second output; a control current circuit, electrically connected to each of the first input, for driving each of the Hall element; and a circuit, electrically connected between adjacent Hall elements, for maintaining the second output of the one adjacent Hall element and the first output of the other adjacent Hall element at the same potential and for preventing current from passing across the adjacent Hall elements, the circuit including a first input electrically connected to the second output of the one adjacent Hall element, a second input electrically connected to the first input of the other adjacent Hall element, and an output electrically connected to the second input of the other adjacent Hall element, whereby the voltage across the first output of the first Hall element and the second output of the last Hall element represents the sum of, or the difference between the voltages across all of the adjacent Hall elements.

9 Claims, 5 Drawing Figures

F I G. 3
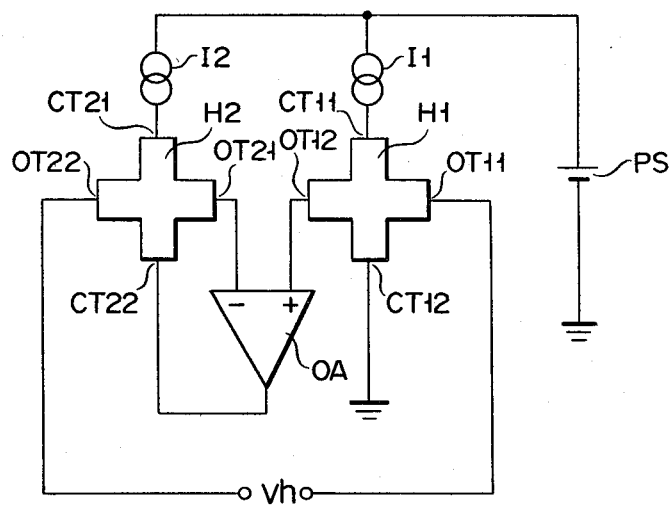
F I G. 5
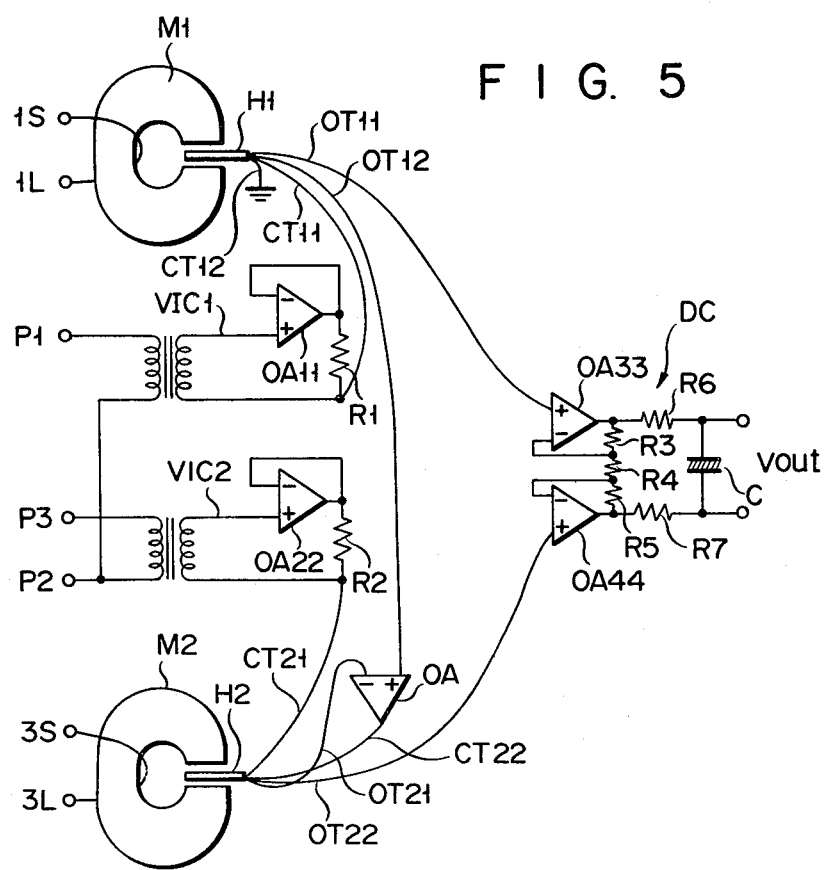

HALL ELEMENT DEVICE

BACKGROUND OF THE INVENTION

This invention relates to a device which comprises a plurality of Hall elements and is designed to determine the sum of, or the difference between, the voltages between all of the adjacent Hall elements.

FIG. 1 shows the arrangement of a conventional Hall element device comprising two Hall elements H1 and H2. One Hall element H1 comprises a first control current-supplying terminal CT11, a second control current-supplying terminal CT12, a first output terminal OT11 and a second output terminal OT12. The other Hall element H2 comprises a first control current-supplying terminal CT21, a second control current-supplying terminal CT22, a first output terminal OT21 and a second output terminal OT22. The first control current-supplying terminal CT11 of the Hall element H1 and the first control current-supplying terminal CT21 of the Hall element H2 are connected to a common power source PS through the corresponding constant current sources I1 and I2. The second control current-supplying terminals CT12 and CT22 of the respective Hall elements H1 and H2 are grounded. The second output terminal OT12 of the first Hall element H1 and the first output terminal OT21 of the second Hall element H2 are connected together by a resistor R. A Hall voltage Vh is produced across the first output terminal OT11 of the first Hall element H1 and the second output terminal OT22 of the second Hall element H2.

Whenever the second output terminal OT12 of the first Hall element H1 and the first output terminal OT21 of the second Hall element H2 of the conventional Hall element device described above have the same potential, current does not run through the resistor R. Whenever the second output terminal OT12 and the second output terminal OT21 have different potentials, then current flows through the resistor R, leading to errors in the measurement carried out by the conventional Hall element device.

A Hall element of FIG. 2 has already been proposed to eliminate the above-mentioned drawback. With this proposed Hall element device, a first Hall element H1 is provided with an independent power source PS1, and a second Hall element is similarly provided with an independent power source PS2. The second output terminal OT12 of the first Hall element H1 and the first output terminal OT21 of the second Hall element H2 are directly connected together. However, the provision of electrically isolated power sources PS1 and PS2 for the first and second Hall elements H1 and H2, respectively, complicates the arrangement of a resultant Hall element device and is uneconomical. Further, the provision of such isolated power sources PS1 and PS2 is accompanied with the drawback that noise readily occurs due to a parasitic capacity being produced across the power sources PS1 and PS2.

SUMMARY OF THE INVENTION

It is accordingly the object of this invention to provide a Hall element device which comprises a plurality of Hall elements and is designed to determine with high precision the sum of, or the difference between, the voltages between adjacent Hall elements.

To attain the above-mentioned object, this invention provides a Hall element device which comprises a plurality of Hall elements including a first and last Hall element, each said Hall element including a first input, a second input, a first output and a second output; control current means, electrically connected to each said first input, for driving each said Hall element; and means, electrically connected between adjacent Hall elements, for maintaining said second output of the one adjacent Hall element and the first output of the other adjacent Hall element at the same potential and for preventing current from passing across the adjacent Hall elements, said means including a first input electrically connected to said second output of one said adjacent Hall element, a second input electrically connected to said first input of the other adjacent Hall element, and an output electrically connected to said second input of the other adjacent Hall element.

The arithmetic results obtained by the addition or subtraction of the voltages between all of the adjacent Hall elements, that is between the first and second output terminal of all of the adjacent Hall elements, are produced between the first output terminal of the first Hall element and the second output terminal of the last Hall element.

With a Hall element device embodying this invention, which is arranged as described above, the output terminals of a plurality of Hall elements constituting the device are connected together by the high input impedance of the corresponding operational amplifiers. Further, an output from the operational amplifier is negatively fed back to the corresponding Hall element. Therefore, the output terminals of all the adjacent Hall elements are always retained at the same potential, thereby making it possible to determine a sum of, or the difference between, the voltages of all the adjacent Hall elements with high precision. As compared with the conventional Hall element device using a fully independent power source for each Hall element, the Hall element device of this invention is less expensive and more effectively suppresses noise.

BRIEF DESCRIPTION OF THE DRAWINGS

Other objects and many of the attendant advantages of this invention will be readily appreciated as the same becomes better understood by reference to the following detailed description when considered in connection with the accompanying drawings, in which like reference characters designate the same or similar parts throughout the figures thereof and wherein:

FIG. 3 sets forth the circuit arrangement of a Hall element device according to a first embodiment of this invention;

FIG. 5 shows a circuit of a 3-phase A.C. wattmeter using any of the Hall element devices embodying the invention.

DETAILED DESCRIPTION OF THE PREFERRED EMBODIMENTS

Figure 1:
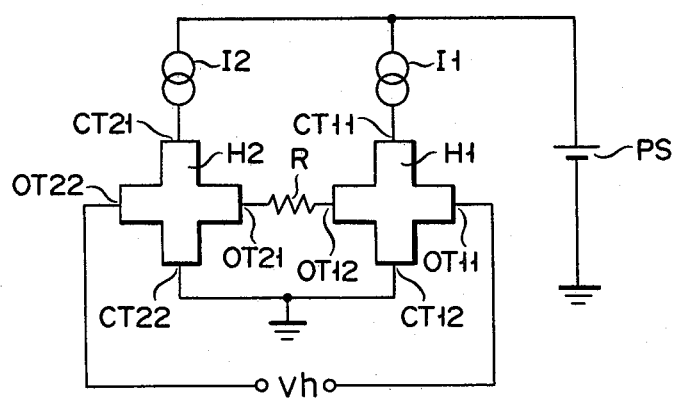
FIG. 1 shows the circuit arrangement of one conventional Hall element device.

Description is now given by reference to FIG. 3 of a Hall element device according to the first embodiment of this invention. The Hall element device of FIG. 3 comprises two Hall elements H1 and H2, two constant current sources I1 and I2 and an operational amplifier OA. The Hall element H1 is provided with a first control current-supplying terminal CT11, a second control current-supplying terminal CT12, a first output terminal OT11 and a second output terminal OT12. The Hall element H2 is provided with a first control current-supplying terminal CT21, a second control current-supplying terminal CT22, a first output terminal OT21 and a second output terminal OT22. The first control current-supplying terminal CT11 of the first Hall element H1, and the first control current-supplying terminal CT21 of the second Hall element H2 are connected to a common power source PS through the corresponding constant current sources I1 and I2. The second output terminal OT12 of the first Hall element H1 is connected to the noninverted input terminal of the operational amplifier OA. The first output terminal OT21 of the second Hall element H2 is connected to the inverted input terminal of the operational amplifier OA. The output terminal of the operational amplifier OA is connected to the second control current-supplying terminal CT22 of the second Hall element H2. The second control current-supplying terminal CT12 of the first Hall element H1 is grounded. An output Hall voltage Vh resulting from the sum of, or the difference between, the voltages of the adjacent first and second Hall elements H1 and H2 is produced across the first output terminal OT11 of the first Hall element H1 and the second output terminal OT22 of the second Hall element H2.

With the Hall element device of this invention arranged as described above, the operational amplifier OA has a fully higher input impedance than the internal resistance of the first and second Hall elements H1 and H2, causing the second output terminal OT12 of the first Hall element H1 to be connected to the first output terminal OT21 of the second Hall element H2 through a high impedance. The first output terminal OT21 of the second Hall element H2 is connected to the inverted input terminal of the operational amplifier OA. The output terminal of the operational amplifier OA is connected to the second control current-supplying terminal CT22 of the second Hall element H2, thereby constituting a negative feedback loop. Therefore, if a change takes place in the potential of the first output terminal OT21 of the second Hall element H2, it is automatically compensated for due to the negative feedback loop. In other words, the second output terminal OT12 of the first Hall element H1 and the first output terminal OT21 of the second Hall element H2 are always maintained at the same potential. Where magnetic fields acting in the same direction are applied to the first and second Hall elements H1 and H2 respectively, then a Hall voltage Vh is produced which results from a sum of the Hall voltage Vh1 of the first Hall element H1 and the Hall voltage Vh2 of the second Hall element H1. Conversely, where magnetic fields acting in the opposite directions are applied to the first and second Hall elements H1 and H2 respectively, then a Hall voltage Vh is produced which results from a difference between the Hall voltages Vh1 and Vh2. Where magnetic fields acting in the same direction are applied to the first and second Hall elements H1 and H2 and in this case currents having the same polarity are made to run through the Hall elements H1 and H2, then a Hall voltage Vh is produced which results from the sum of the Hall voltage Vh1 of the first Hall element H1 and the Hall voltage Vh2 of the second Hall element H2. In the above-mentioned case, where currents having the opposite polarities are made to run through the first and second Hall elements, a Hall voltage Vh is obtained which results from a difference between the Hall voltages Vh1 and Vh2.

Figure 2:
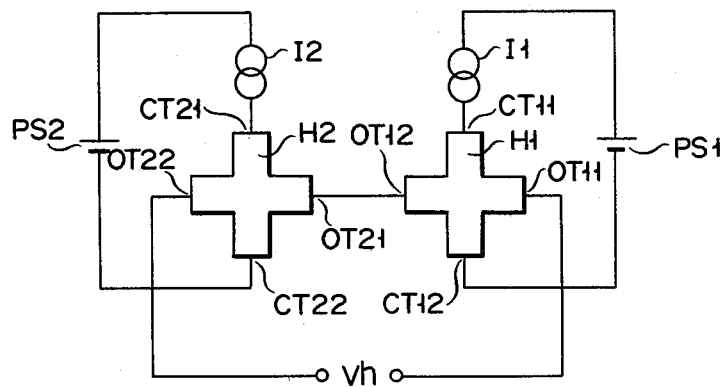
FIG. 2 indicates the circuit arrangement of another conventional Hall element device.

With the Hall element device of FIG. 3 according to the first embodiment of this invention, no current passes across the connected Hall elements as is the case with the conventional Hall element device of FIG. 1, thereby enabling measurement to be made with high precision without errors. Further, the Hall element device of this invention is not provided with electrically isolated power sources as is the case with another conventional Hall element device of FIG. 2. Therefore, the Hall element device of the invention offers the advantages that the Hall element device as a whole is simplied in arrangement and reduced in cost; no noise results from the parasistic capacity across the power source; and since the output terminals of the first and second Hall elements H1 and H2 are kept at the same potential, unbalanced voltage occurring between the first and second Hall elements H1 and H2 can be compensated by adjusting the control current.

According to the first embodiment of this invention as shown in FIG. 3, a constant current source acting as a type of voltage-current conversion unit is applied to supply power to the first and second Hall elements H1 and H2. In this case, the level of the output voltage for each Hall element varies with the intensity of a magnetic field applied to the Hall elements H1 and H2. When the above-mentioned constant current source is replaced by voltage-current conversion device having an output current which varies with input voltage, then it is possible to change the output voltages of the Hall elements by varying the intensity of the magnetic field applied to the Hall elements and by varying the intensity of the control current running through the Hall elements.

Figure 4:
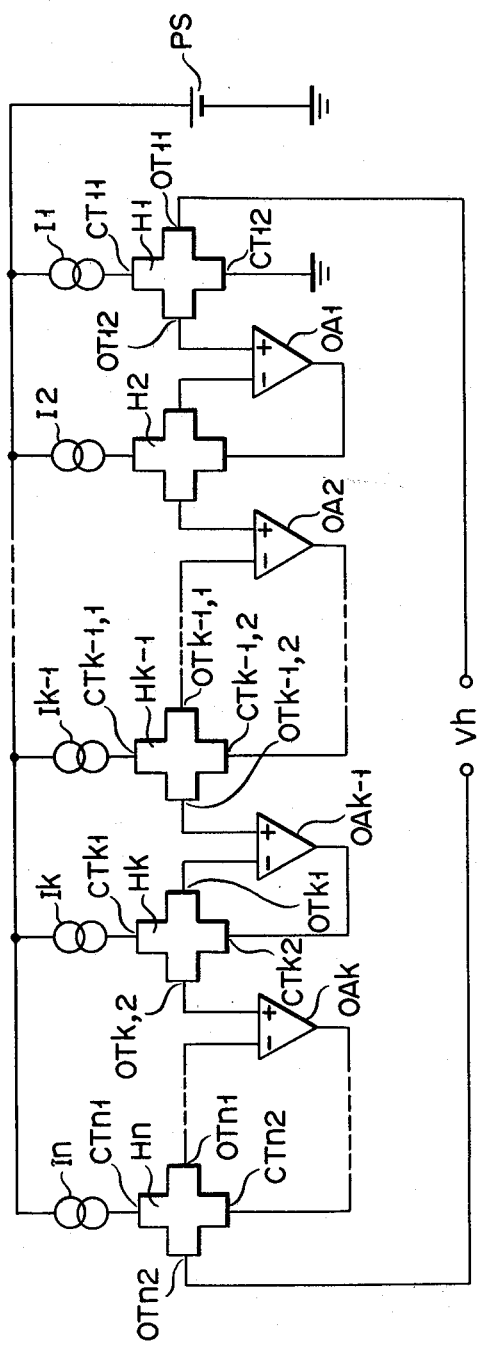
FIG. 4 illustrates the circuit arrangement of a Hall element device according to a second embodiment of the invention.

Description is now given with reference to FIG. 4 of a Hall element device according to the second embodiment of this invention. With this second embodiment, an n number of Hall elements H1, . . . Hk−1, Hk, . . . , Hn are used. The first control current-supplying terminal CTk−1, 1 of each Hall element Hk−1 (k=2 to n) is connected to a common power source PS through the corresponding constant current source Ik−1. An operational amplifier OAk−1 is set between Hall elements Hk−1, Hk. The noninverted input terminal of the operational amplifier OAk−1 is connected to the second output terminal OTk−1,2 of the Hall element Hk−1. The inverted input terminal of the operational amplifier OAk−1 is connected to the first output terminal OTk,1 of the Hall element Hk. The output terminal of the operational amplifier OAk−1 is connected to the second control current-supplying terminal OTk,1 of the Hall element Hk. The second control current-supplying terminal CT12 of the first Hall element H1 is grounded. A voltage Vh representing the sum of, or difference between, the voltages between all of the adjacent Hall elements H1 to Hn is produced between the first output terminal OT11 of the first Hall element H1 and the second output terminal OTn2 of the Hall element Hn having an n order.

Description is now given with reference to FIG. 5 of a 3-phase AC wattmeter using a Hall element device embodying this invention. A first voltage-current converter VIC1 supplies the first control current-supplying terminal CT11 of the first Hall element H1 with a control current proportional to a load voltage V(P1-P2)

across the terminals P1 and P2. A second voltage-current converter VIC2 supplies the first control current-supplying terminal CT21 of the second Hall element H2 with a control current proportional to a load voltage V(P3-P2) impressed between the terminals P3 and P2. The voltage-current converter VIC1 comprises an operational amplifier OA11 and a load resistor R1. The voltage-current converter VIC2 comprises an operational amplifier OA22 and a load resistor R2. The voltage-current converter VIC1 supplies the Hall element H1 with a current proportional to a voltage impressed on the operational amplifier OA1. The voltage-current converter VIC2 supplies the Hall element H2 with a current proportional to a voltage impressed on the operational amplifier OA2.

A magnet M1 supplies the first Hall element H1 with a magnetic field proportional to a load current I(1S-1L) running across the terminals 1S and 1L. A magnet M2 supplies the second Hall element with a magnetic field proportional to a load current I(3S-3L) flowing across the terminals 3S and 3L. The second control current supplying terminal CT12 of the first Hall element H1 is grounded. The second output terminal OT12 of the first Hall element H1 is connected to the noninverted input terminal of the operational amplifier OA. The first output terminal OT21 of the second Hall element H2 is connected to the inverted input terminal of the operational amplifier OA. The second control current-supplying terminal CT22 of the second Hall element H2 is connected to the output terminal of the operational amplifier OA.

The first output terminal OT11 of the first Hall element H1 and the second output terminal OT22 of the second Hall element H2 are connected to a detection circuit DC. The detection circuit DC comprises operational amplifiers OA33 and OA44, resistors R3 to R7, and capacitor C, and can measure the Hall voltage Vh without being affected by the Hall resistance of the Hall element. The detection circuit DC sends forth a voltage Vout proportional to the power consumed.

The above-mentioned 3-phase wattmeter, using a Hall element device embodying this invention, can measure power consumption with high precision and is affected very little by noise because of the simple circuit arrangement.

What we claim is:
1. A Hall element device, comprising:
a plurality of Hall elements including a first and last Hall element, each said Hall element including a first input, a second input, a first output and a second output;
control current means, electrically connected to each said first input, for driving each said Hall element; and
means, electrically connected between adjacent Hall elements, for maintaining said second output of the one adjacent Hall element and the first output of the other adjacent Hall element at the same potential and for preventing current from passing across the adjacent Hall elements, said means including a first input electrically connected to said second output of one said adjacent Hall element, a second input electrically connected to said first output of the other adjacent Hall element, and an output electrically connected to said second input of the other adjacent Hall element, whereby the voltage across the first output of the first Hall element and the second output of the last Hall element represents the sum of, or the difference between the voltages across all of said adjacent Hall elements.

2. A Hall element device, according to claim 1, wherein
each said means for maintaining and for preventing is an operational amplifier.

3. A Hall element device, according to claim 1, further comprising:
a single power source, electrically connected to said control current means.

4. A Hall element device, according to claim 2 or 3, wherein
each said operational amplifier has an input impedance higher than the input impedance of said adjacent Hall elements and provides a feedback loop to maintain said second output of the one adjacent Hall element and said first output of the other adjacent Hall element at the same potential.

5. A Hall element device comprising:
a first and second Hall element operably connected to said device, each said Hall elements including a first input, a second input, a first output and a second output, said second input of said first Hall element connected to ground;
magnetic field means, operably connected to said device, for influencing said first and second Hall element with a magnetic field;
first converter means, connected to said first input of said first Hall element, for controlling said first Hall element with a current proportional to a first load voltage;
second converter means, connected to said first input of said second Hall element, for controlling said second Hall element with a current proportional to a second load voltage;
circuit means having a first input connected to said first output of said first Hall element, a second input connected to said first output of said second Hall element and an output connected to said second input of said second Hall element, for maintaining said first outputs of said first and second Hall elements at the same potential and for preventing current from passing across said first and second Hall elements; and
detector circuit means having a first input connected to said second output of said first Hall element and a second input connected to said second output of said second Hall element, for detecting a voltage proportional to the power consumed.

6. A Hall element device, according to claim 5, wherein
said circuit means is an operational amplifier and
said first and second converter means each includes a transformer, an operational amplifier having an input connected to said transformer and an output, and a resistor connected to said output of said operational amplifier.

7. A Hall element device according to claim 5, wherein
said detector circuit means includes first and second operational amplifier each having a first input, a second input and an output, said first input of said first operational amplifier connected to said second output of said first Hall element and said first input of said second operational amplifier connected to said second output of said second Hall element, and a resistor capacitor circuit connected to each said output and each said second input.

8. A Hall element device which comprises:

an n (n≧2) number of voltage-current conversion units supplied with a first reference potential;

an n−1 number of operational amplifiers each having a noninverted input terminal and an inverted input terminal, and an output terminal; and an n number of Hall elements, each of which has first and second control current-supplying terminals and first and second output terminals, the first control current-supplying terminal of each Hall element being connected to the corresponding voltage-current conversion unit, each of said operational amplifiers being connected between respective adjacent Hall elements, the noninverted input terminal of each said operational amplifier having a k−1 order (k=2, ..., n) being connected to the second output terminal of a respective Hall element having a k−1 order, the inverted input terminal of each said operational amplifier having a k−1 order being connected to the first output terminal of a respective Hall element having a k order, the output terminal of each said operational amplifier having a k−1 order being connected to the second control current-supplying terminal of a respective Hall element having a k order, the second control current-supplying terminal of the first Hall element being supplied with a second reference potential, such that a voltage representing a sum of, on the difference between, the voltages between said adjacent Hall elements is produced across the first output terminal of the first Hall element and the second output terminal of a Hall element having an n order.

9. The Hall element device according to claim 8, wherein the voltage-current conversion unit is formed of a constant current circuit.

* * * * *